US006811936B2

United States Patent
Smith et al.

(12) United States Patent
(10) Patent No.: US 6,811,936 B2
(45) Date of Patent: Nov. 2, 2004

(54) STRUCTURE AND PROCESS FOR A PELLICLE MEMBRANE FOR 157 NANOMETER LITHOGRAPHY

(75) Inventors: Steven Smith, Gilbert, AZ (US); Sang-In Han, Phoenix, AZ (US)

(73) Assignee: Freescale Semiconductor Inc., Austin, TX (US)

( * ) Notice: Subject to any disclaimer, the term of this patent is extended or adjusted under 35 U.S.C. 154(b) by 94 days.

(21) Appl. No.: 10/334,297

(22) Filed: Dec. 31, 2002

(65) Prior Publication Data

US 2004/0126671 A1 Jul. 1, 2004

(51) Int. Cl.[7] .............................. G03F 9/00; A47G 1/12
(52) U.S. Cl. ............................................. 430/5; 428/14
(58) Field of Search .................................. 430/5; 428/14, 428/428, 698; 250/492.2

(56) References Cited

U.S. PATENT DOCUMENTS 6,544,693 B2 * 4/2003 Levinson et al. .............. 430/5

2004/0121248 A1 * 6/2004 Eynon .......................... 430/5

* cited by examiner

Primary Examiner—S. Rosasco

(57) ABSTRACT

A pellicle membrane structure (800) is made by a process that includes depositing (115) a etch mask layer (110) on the backside of the semiconductor wafer, depositing (120) a first pellicle membrane protection layer (205) on a frontside of the semiconductor wafer, depositing (125) a layer of membrane material (210) that is preferably SiOF on the first membrane protection layer, and depositing (130) a second pellicle membrane protection layer (215) on the membrane material layer, forming a pattern (140) for an opening (410) in the semiconductor, and etching (150) to form the opening. Oxygen plasma (155) is then used to remove carbon from the exposed portions of the pellicle membrane protection layers, which are preferably SiCN, which in the preferable embodiment changes the exposed surfaces to SiOF, thereby forming a thin SiOF membrane (715) over the opening.

23 Claims, 4 Drawing Sheets

STRUCTURE AND PROCESS FOR A PELLICLE MEMBRANE FOR 157 NANOMETER LITHOGRAPHY

FIELD OF THE DISCLOSURE

This disclosure relates generally to thin transparent membranes, and more particularly to a silicon oxygen fluoride (SiOF) membrane that can be used as a pellicle for radiation wavelengths of approximately 157 nanometers, and a process for fabricating such an SiOF membrane.

BACKGROUND

Optical lithography is evolving to the use of light having a wavelength of 157 nanometers (nm), which enables the patterning of line widths that are on the order of 70 nm. To prevent particulate contamination of photomasks used in such lithography, thin membranes ("pellicles") could be placed a few millimeters away from the mask in a sealed package, as is done in longer wavelength lithographic systems. A high quality pellicle for 157 nm lithography must satisfy a number of critical requirements, such as high transmission at 157 nm, damage resistance to 157 nm irradiation, and thinness. The thinner the pellicle is, the better it is for keeping the light transmission high and keeping the pellicle from being a substantial factor in the system optics. The pellicle materials currently used at 248 and 193 nm are fluorocarbon polymers, but their 157-nm properties are not satisfactory. Other materials are proposed for use as pellicles at 157 nm. A first example is new polymer materials based on fluorocarbons, that may differ in particulars from the polymers used in 193- or 248-nm lithographic systems. The challenges that must be overcome with these new polymer materials are insufficient transmissivity and photoinduced degradation from use with the 157 nm wavelength. A second example is the use of a modified, fluorinated fused silica, a material which has proven itself highly transmissive at 157 nm. However, practical methods for preparing this material in micron thicknesses have not been found. The use of polishing techniques limits the thinness to about 1 millimeter, causing the finished membrane to become a significant factor in the system optics.

What is needed is a new pellicle that is thin and highly transmissive at 157 nm that does not degrade after use in a 157 nm lithographic system and can sustain normal handling for such devices.

SUMMARY OF THE INVENTION

In a first aspect of the present invention, a process is for fabricating a pellicle membrane structure. The process includes depositing an etch mask layer on a backside of a semiconductor wafer, depositing a first layer of pellicle membrane protection material that includes carbon on a frontside of the semiconductor wafer, depositing a layer of membrane material on the first layer of pellicle membrane protection material, and depositing a second layer of pellicle membrane protection material that includes carbon on the layer of membrane material. The process further includes patterning the etch mask layer to form an opening within at least one area of the semiconductor wafer, etching the semiconductor wafer to remove semiconductor material in the opening up to an exposed portion of the first layer of pellicle membrane protection material. The process further includes exposing a structure comprising the patterned etch mask layer, the etched semiconductori wafer, the first layer of pellicle membrane protection material, the layer of membrane material, and the second layer of pellicle membrane protection material to an oxygen plasma until the carbon in the second layer of pellicle membrane protection material and the exposed portion of the first layer of pellicle membrane protection material is removed from the structure.

In a second aspect of the present invention, a pellicle membrane structure includes a layer of crystalline semiconductor material having a backside, a frontside and a periphery with an opening through the crystalline semiconductor material from the backside to the frontside; a layer of pellicle membrane protection material on a portion of the frontside of the crystalline semiconductor material, between the opening and the periphery; and a layer of membrane material having a thickness less than 6 microns that covers the opening and is also on the layer of pellicle membrane protection material.

BRIEF DESCRIPTION OF THE DRAWINGS

The present invention is illustrated by way of example and not limitation in the accompanying figures, in which like references indicate similar elements, and in which.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE DRAWINGS

Figure 1:
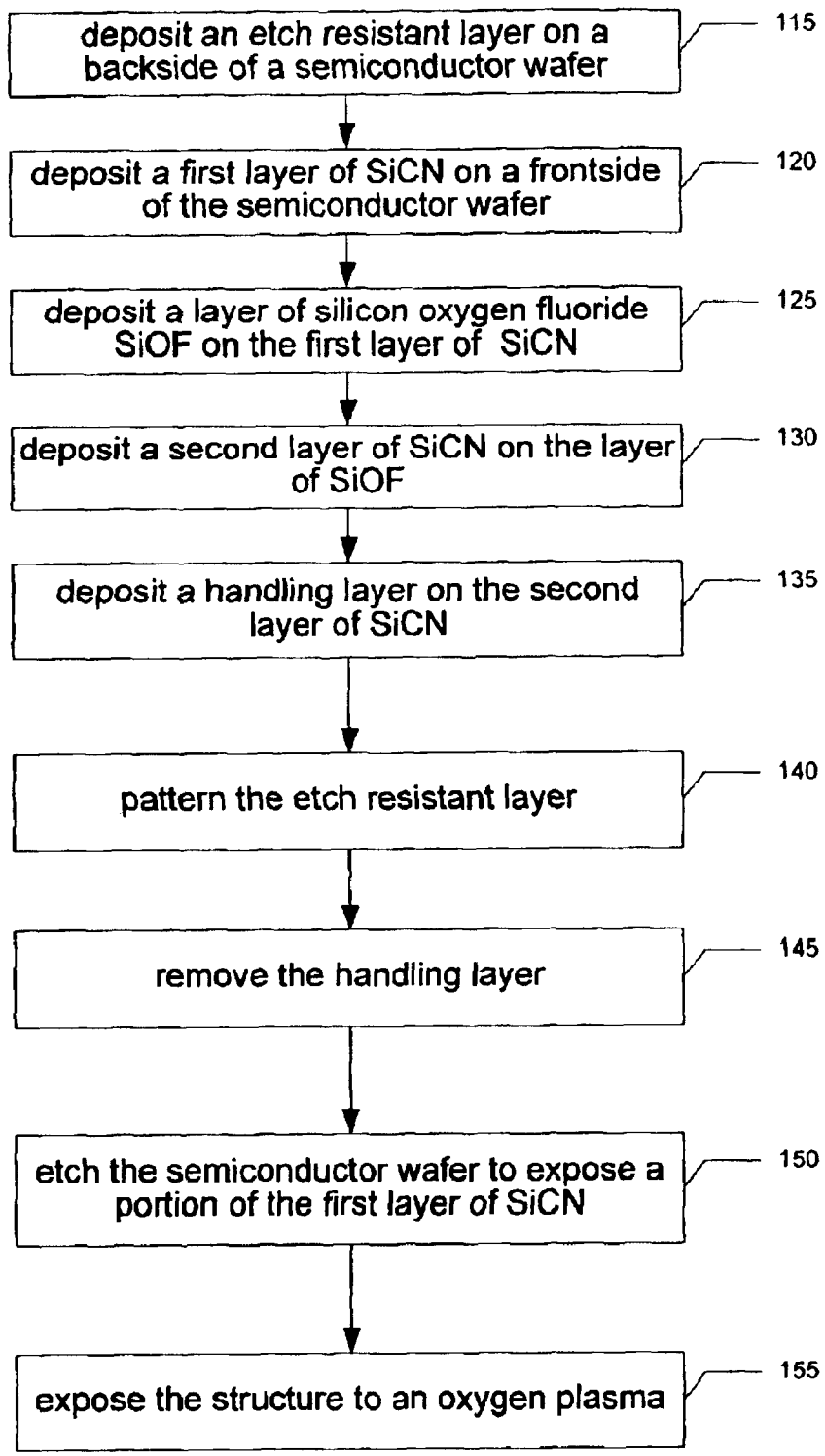
FIG. 1 is a flow chart of a process to fabricate a pellicle membrane structure, in accordance with the preferred and alternative embodiments of the present invention.
Figure 2:
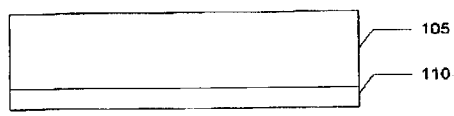
FIGS. 2–8 are cross sectional diagrams of the pellicle membrane structure in various stages of fabrication, in accordance with the preferred and alternative embodiments of the present invention.

Referring to FIGS. 1–8, a flow chart (FIG. 1) and corresponding structural cross sectional diagrams (FIGS. 2–8) show a pellicle membrane structure 800 (FIG. 8) in stages of fabrication and a process for fabricating the pellicle membrane structure 800, in accordance with a preferred and alternative embodiments of the present invention. Some steps of the process that are obvious to one of ordinary skill in the art or that may be described elsewhere in this document may not be shown in the flow chart or explicitly described, but would be used in the method. Referring to FIGS. 1 and 2, an etch mask layer 110 is deposited at step 115 on a backside of a semiconductor wafer 105. The semiconductor wafer 105 is preferably a wafer of monocrystalline silicon that has a diameter large enough to yield a membrane with an opening to fit the optics of the lithography systems in which it will be used. To accommodate the pellicle size for 157 nm lithography, it is desirable to start with 150 millimeter ("6 inch") diameter silicon substrates. The semiconductor wafer 105 is preferably an inexpensive silicon wafer that need not be of a high quality in terms of the parameters (e.g., dislocation density) that characterize the wafer for use in high density or high performance integrated circuit fabrication. The semiconductor wafer 105 needs to be thick enough to be handled, when fabrication is complete, using practices that are used for conventional lithography systems. For a 150 millimeter diameter silicon wafer, this thickness is on the order of 0.725 millimeters. A crystal orientation of <100> of the Si semiconductor wafer 105 is preferred, in order to obtain a well-defined geometry after etching. A semiconductor material of another material could be considered for use as the semiconductor wafer 105. The etch mask layer 110 is a material that can be economically patterned and that is resistant to an etchant that will be used in a later step to etch the semiconductor wafer 105. The etch mask layer 110 is deposited to a thickness that will allow it to withstand handling during the process of fabrication without losing its integrity, by not allowing etching to occur in non-patterned areas. In accordance with the preferred embodiment of the present invention, the etchant that is used in a later step is potassium hydroxide (KOH), and the etch mask layer 110 is a first layer of silicon carbide nitride (SiCN) deposited to a thickness of approximately 2000 Angstroms, and is at least 600 Angstroms thick. The etch mask layer 110 of SiCN is deposited by a conventional technique, preferably plasma enhanced chemical vapor deposition (PECVD) in a gaseous mixture of $CH_4$, $SiH_4$, and $N_2$. In accordance with an alternative embodiment of the pellicle membrane structure, the etch mask layer 110 can be of another etch mask material that is resistant to KOH, or some other etch mask material that is selected, for example, for etching another semiconductor material.

Figure 3:
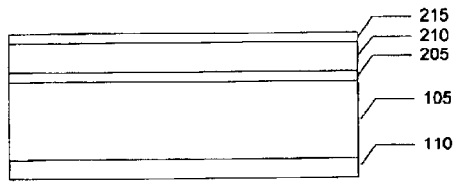

Referring to FIG. 1 and FIG. 3, a second layer of SiCN 205 is deposited at step 120 on the frontside of the semiconductor wafer 105 to a thickness of approximately 1000 Angstroms (within a thickness range from 500 to 1500 Angstroms), then a layer of silicon oxygen fluoride (SiOF) 210 is deposited on the second layer of SiCN 205 to a thickness of approximately 4 microns at step 125, followed at step 130 by a deposition of a third layer of SiCN 215 on the SiOF layer 210 to a thickness of approximately 500 to 1500 Angstroms, in accordance with the preferred embodiment of the present invention. The second and third layers of SiCN 205, 215 can be made thicker, (for example, up to 10,000 Angstroms), but greater thickness causes more processing costs during the oxygen plasma step 155 (described below with reference to FIGS. 1 and 8) without providing substantial technical benefits. The second and third SiCN layers 205, 215 are deposited by the same techniques described above with reference to FIGS. 1 and 2. The SiOF layer 210 is deposited by conventional techniques, preferably using a selection of precursor materials that contain a Silicon source (TEOS, $SiH_4$, $SiF_4$), an oxygen source ($O_2$), and a fluorine source ($C_2F_6$, $CF_4$, $SiF_4$). Using the PECVD technique affords an ability to use a wide assortment of chemical precursors to produce a pellicle membrane having substantially uniform properties for many processed wafers.

The thickness of the SiOF layer 210 is chosen to provide sufficient handling strength of the completed pellicle membrane structure 800 (FIG. 8) while minimizing its thickness to reduce its impact as an optical element in a photolithographic system. For large pellicle membranes, which can be generated from 100 to 150 millimeter Si substrates), a membrane thickness of approximately 1 to 4 microns appears to be optimum, but it may be necessary to make it thicker (for example, up to 6 microns) for mechanical stability, or provide intervening support members, as described below (see FIGS. 12–13). Smaller pellicle membranes could be made thinner and would have sufficient strength, while further reducing their impact as an optical element in a photolithographic system.

The layers of SiCN 205, 215 are sufficiently thick to protect the SiOF layer 210 from the etchant used in step 150 (described below), and are also called, respectively the first and second pellicle membrane protection layers 205, 215. The first and second pellicle membrane protection layers 205, 215 could be of another material that can protect the SiOF layer 210 during the formation of the opening 410 at step 150 (described below with reference to FIGS. 1 and 7). One example is SiOC, but SiCN is preferred for its better hardness and better ability to resist deterioration when KOH is the etchant. The use of SiOC would result in the use of thicker layers 205, 215 that are deposited using techniques known to those of ordinary skill in the art. SiOC could also be used as the etch mask layer 110, but has the same disadvantage.

The SiOF layer 210 can alternatively comprise a material other than SiOF that is sufficiently transmissive at 157 nanometers, such as calcium fluoride (CaF2), magnesium fluoride (MgF2) or aluminum fluoride (AlF3), but SiOF is preferred for its combined characteristics of transmissivity and ease of processing. Because other materials can be used, this layer is also referred to as the membrane material layer 210.

Figure 4:
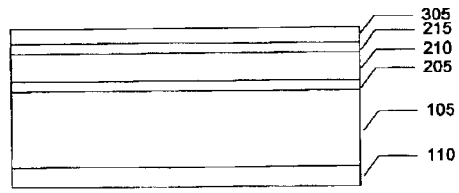
Figure 5:
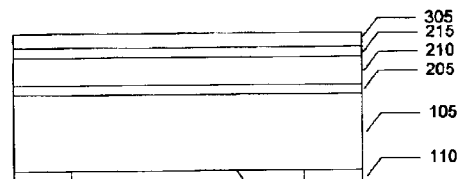

Referring to FIGS. 1, 4 and 5, a handling layer 305 is deposited on top of the second pellicle membrane protection layer 215 at step 135 to minimize handling damage during processing, in accordance with the preferred embodiment of the present invention. Then, at step 140, a pattern for backside etching of the semiconductor substrate 105 is made in the etch mask layer 110. The handling layer 305 comprises any material that is suitable to protect the second pellicle membrane protection layer 215 during the fabrication of the etch pattern. In accordance with the preferred embodiment of the present invention, the handling layer 305 is a conventional photo resist material, although it could be another material such as chromium. The etch pattern forms at least one opening 410 in an area of the wafer that exposes the backside of the semiconductor wafer 105 in the opening 410. A low resolution photolithographic process is satisfactory for the formation of the etch pattern. The opening 410 is preferably a square shape as shown below (FIG. 9) in the preferred embodiment of the present invention. The sides of the square pattern should be lithographically aligned to the (100) crystal planes of the silicon substrate to form a well defined pattern transfer into the silicon substrate after etching.

Figure 6:
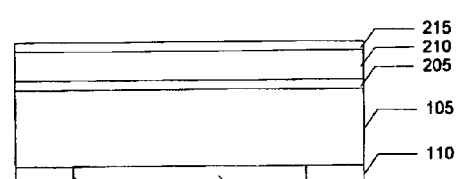

Referring to FIGS. 1 and 6, the handling layer 305 is removed at step 145. In accordance with the preferred embodiment of the present invention, the handling layer 305 is removed by conventional technique for removing the conventional photoresist layer deposited at step 135. If another material, such as chromium is used, it is removed using processes that do not destroy the integrity of the pellicle membrane protection layer 215.

Figure 7:
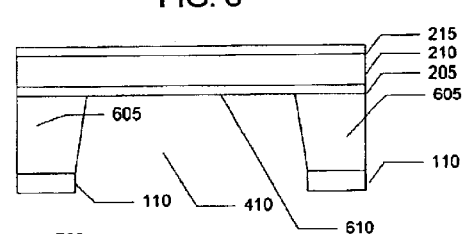

Referring to FIGS. 1 and 7, the partially completed pellicle membrane structure 700 is etched at step 150 to remove the material of the semiconductor wafer 105 within the opening, up to the first pellicle membrane protection layer 205, thereby making an exposed portion 610 of the first pellicle membrane protection layer 205 within the opening 410. In accordance with the preferred embodiment of the present invention, the etching is accomplished anisotropically from the backside, using hot (98 degrees Centigrade) potassium hydroxide (KOH). In accordance with the preferred embodiment of the present invention, there is a single opening 410 that leaves a peripheral wall 605 of the semiconductor wafer between a periphery 740 of the semiconductor wafer and edges of the opening 410.

Figure 8:
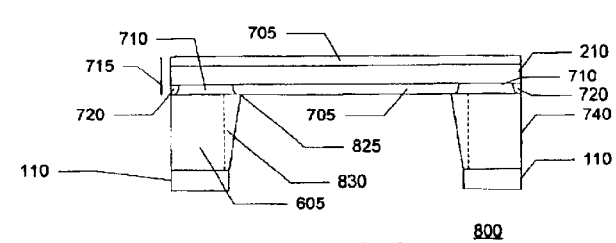
Figure 9:
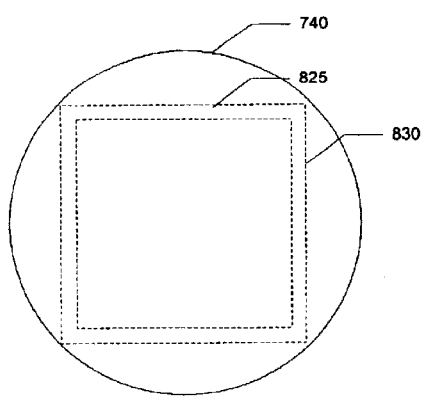
FIG. 9 is a plan view of the pellicle membrane structure at the fabrication stage in which it is shown in FIG. 8.
Figure 10:
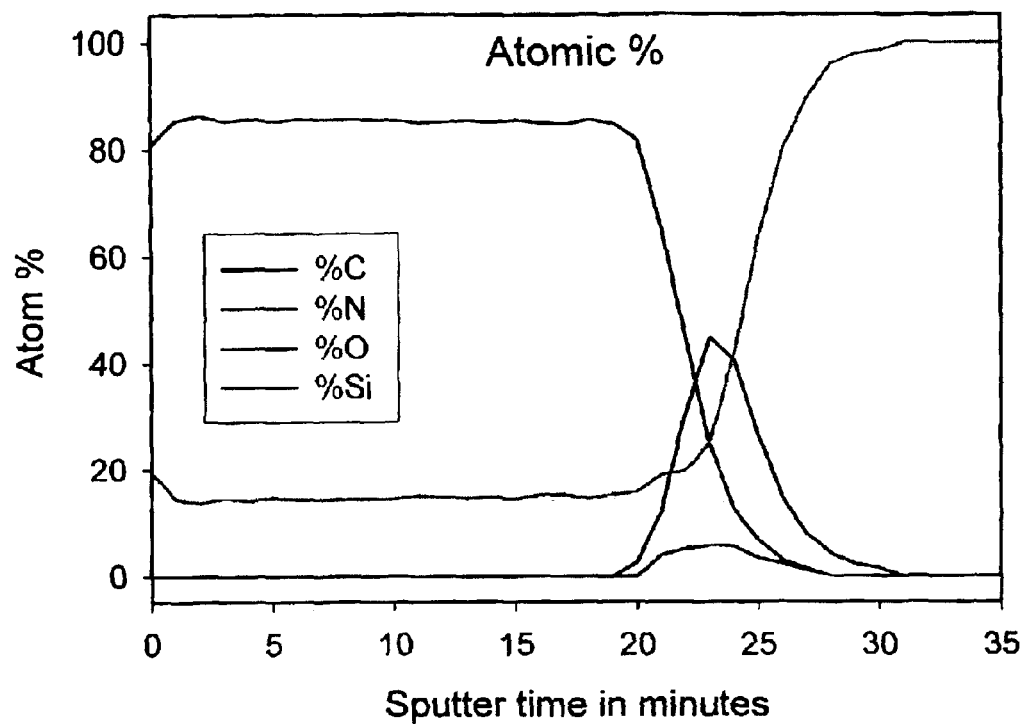
FIG. 10 is an Auger electron spectroscopy depth profile of a surface of the pellicle membrane structure, in accordance with the preferred embodiment of the present invention.
Figure 11:
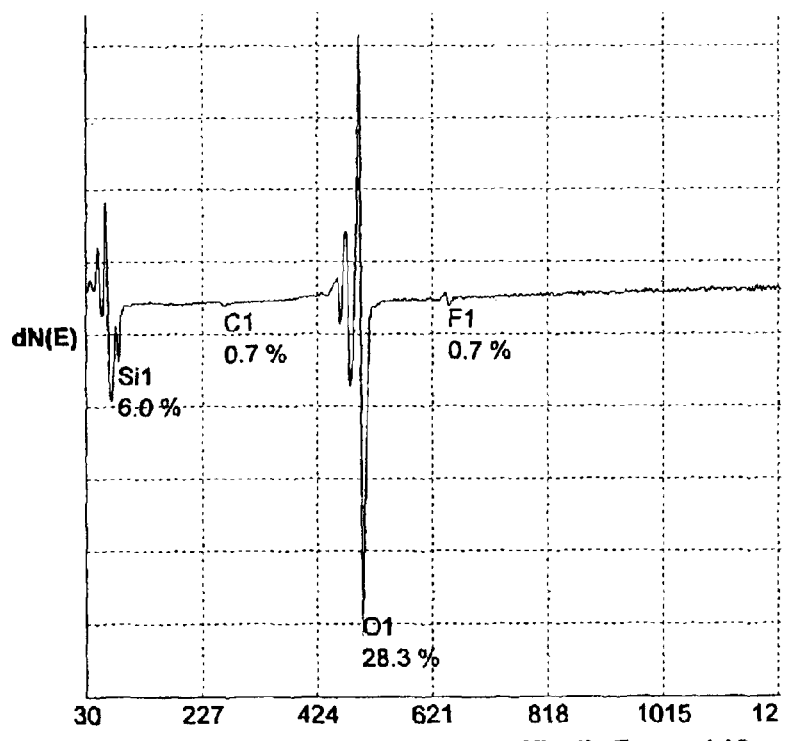
FIG. 11 is an Auger electron spectroscopy surface profile of a surface of the pellicle membrane structure, in accordance with the preferred embodiment of the present invention.

Referring to FIGS. 1, 8, 9, 10, and 11, the pellicle membrane structure 800 is essentially completed by exposing the pellicle membrane structure 800 to a conventional oxygen plasma process at step 155 long enough to convert the second pellicle membrane protection layer 215 and the exposed portion of the first pellicle membrane protection layer 205 to fullyoxidized SiO layers 705. (Edges 720 of the first pellicle membrane protection layer 205 and some portion, including up to all of the etch mask 110 are also converted to SiO.) Referring to FIG. 10, an Auger electron spectroscopy (AES) depth profile taken for a layer of SiCN deposited on a silicon wafer that was exposed to oxygen plasma for approximately one half the duration expected to be used in production (one hour) shows that the nitrogen leaves the layer during the oxidation of the carbon and the SiCN film is almost entirely convertered to SiO. An AES surface profile shown in FIG. 11, taken on a layer of SiCN deposited over a Si substrate, after the oxygen plasma process, shows that fluorine autodoping has occurred within layer 705. The exposed portions of first pellicle membrane protection layer 205 are similarly converted during the oxygen plasma process used in step 155. The result is a pellicle membrane structure 800 comprising a pellicle membrane 715 that comprises the membrane material layer 210 and the converted portions 705 of pellicle membrane protection layers 205, 215.

Figure 12:
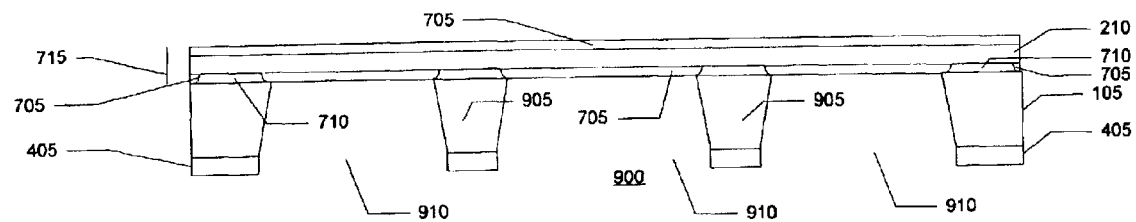
FIG. 12 is a cross sectional diagram of a pellicle membrane structure, in accordance with alternative embodiments of the present invention.
Figure 13:
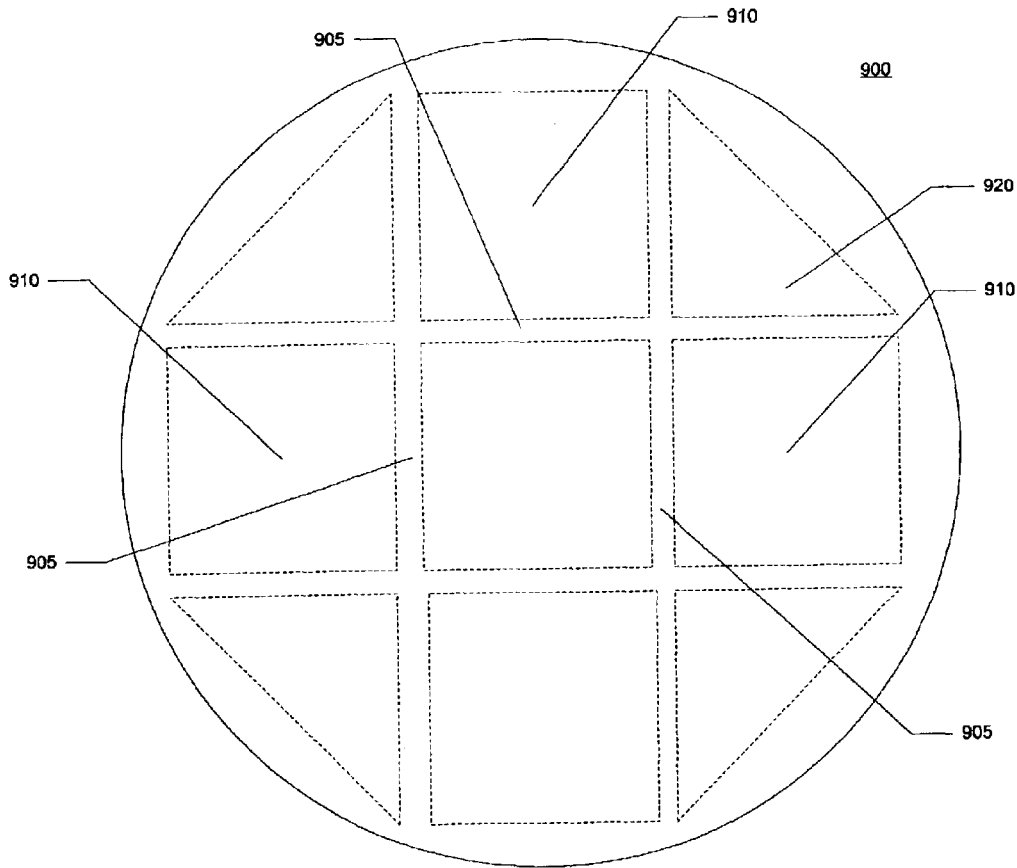
FIG. 13 is a plan view of a pellicle membrane structure, in accordance with alternative embodiments of the present invention.

FIG. 9 shows a top plan view of the pellicle membrane structure 800. A juncture 825 of an inside surface of the peripheral wall 605 of the semiconductor wafer with the exposed backside of pellicle membrane 715 is shown as a dotted line in FIG. 9. Also shown in FIGS. 8 and 9 are cutting lines 830, where the pellicle membrane structure 800 can be cut to provide the pellicle membrane structure in the form of a square with supporting walls located between the sets of lines 825, 830. In addition to providing a very thin pellicle membrane 715, the process described herein above also results in a pellicle membrane 715 that has a smoother surface than the membrane material layer as obtained by the single layer deposition in step 125, thereby further lessening the optical impact of the pellicle membrane structure 800. By using SiCN for the etch mask layer 110 as well as the pellicle membrane protection layers 205, 215, it will be appreciated that a single process is used for all three layers, thereby making the process quite efficient. Referring to FIGS. 12 and 13, a cross section and plan view of a pellicle membrane structure 900 is shown, in accordance with alternative embodiments of the present invention. A plurality of openings 910, 920 (FIG. 13) are made in areas of the etch mask 110, within the peripheries of intervening semiconductor support members 905 and the periphery 740 of the wafer, by the same processes describes above, but by using different etch patterns. In one of these alternative embodiments, the openings 910, 920 can be designed to match areas of a reticle used in the lithographic system, in which case the intervening semiconductor support members 905 are located in areas that are not patterned in an object semiconductor wafer by the reticle. The pellicle membrane structure illustrated in FIG. 13 shows triangular openings 920 and square openings 910, which would be useful for a structure that is provided in the circular form shown, or in a hexagonal form if cut down slightly, but it will be appreciated that other patterns could be used. For example, if a pellicle membrane structure was needed that was in the shape of a square when completed, then it could be formed similarly to the plan view shown in FIG. 8, but with, for example, nine square openings within a large square. The use of the intervening semiconductor support members 905 allows the pellicle membranes in each opening 910, 920, to be thinner than would otherwise be practical.

In another example, if the pellicle membrane structure were to be used in a scanning type of lithography system, as may be used for 300 millimeter object wafers, then the opening 410 may be formed as a large rectangle.

In another of these alternative embodiments, the openings 920 would not be patterned and etched; only the openings 910 would be patterned and etched. Then the wafer would be cut along the center axes of the intervening semiconductor support members 905, thereby resulting in the fabrication of a plurality of pellicle membrane wafers. In the example illustrated, five such pellicle membrane wafers would be formed. Of course, other patterns can also be achieved in this instance.

In summary, persons of ordinary skill in the art will readily appreciate that economical pellicle membrane structures and methods for fabricating them have been described provide pellicle membrane structures useful at 157 nm.

In the foregoing specification, the invention and its benefits and advantages have been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims.

As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The terms "a" or "an", as used herein, are defined as one or more than one. The term "plurality", as used herein, is defined as two or more than two. The term "another", as used herein, is defined as at least a second or more. The terms "including" and/or "having", as used herein, are defined as comprising.

What is claimed is:

1. A process for fabricating a silicon oxygen flouride pellicle membrane structure, comprising:

depositing a first layer of silicon carbon nitride (SiCN) on a backside of a silicon wafer having a periphery;

depositing a second layer of SiCN on a frontside of the silicon wafer;

depositing a layer of silicon oxygen fluoride (SiOF) on the second layer of SiCN;

depositing a third layer of SiCN on the layer of SiOF;

depositing a handling layer on the third layer of SiCN;

patterning the first layer of SiCN to form an opening within the periphery of the silicon wafer;

removing the handling layer;

etching the silicon wafer in the opening to remove the silicon up to an exposed portion of the second layer of SiCN; and exposing a structure comprising the patterned first layer of SiCN, the etched silicon wafer, the second layer of SiCN, the layer of SiOF, and the third layer of SiCN to an oxygen plasma until carbon and nitrogen in the third layer and the exposed portion of the second layer of SiCN are removed from the structure.

2. A process for fabricating a pellicle membrane structure, comprising:

depositing an etch mask layer on a backside of a semiconductor wafer;

depositing a first layer of pellicle membrane protection material that includes carbon on a frontside of the semiconductor wafer;

depositing a layer of membrane material on the first layer of pellicle membrane protection material;

depositing a second layer of pellicle membrane protection material that includes carbon on the layer of membrane material;

patterning the etch mask layer to form an opening within at least one area of the semiconductor wafer;

etching the semiconductor wafer to remove semiconductor material in the opening up to an exposed portion of the first layer of pellicle membrane protection material; and exposing a structure comprising the patterned etch mask layer, the etched semiconductor wafer, the first layer of pellicle membrane protection material, the layer of membrane material, and the second layer of pellicle membrane protection material to an oxygen plasma until the carbon in the second layer of pellicle membrane protection material and the exposed portion of the first layer of pellicle membrane protection material is removed from the structure.

3. The process according to claim 2, wherein the semiconductor wafer comprises silicon.

4. The process according to claim 2, wherein the membrane material comprises one of Silicon Flouride (SiOF), calcium fluoride ($CaF_2$), magnesium fluoride ($MgF_2$) and aluminum fluoride ($AlF_3$).

5. The process according to claim 2, wherein the pellicle membrane protection material is one of SiCN and SiOC.

6. The process according to claim 2, further comprising:

depositing a handling layer on the second layer of pellicle membrane protection material; and removing the handling layer.

7. The process according to claim 6, wherein the handling layer comprises a photoresist material.

8. The process according to claim 2, further comprising dicing the structure to include at least one area in each die.

9. The process according to claim 2, wherein the at least one area is the entire Si wafer.

10. The process according to claim 2, wherein the etch mask layer is a layer of SiCN that is at least 1000 Angstroms thick.

11. The process according to claim 2, wherein the first and second pellicle membrane protection layers comprise SiCN and have a thickness that is within a range from 500 to 1500 angstroms.

12. The process according to claim 2, wherein the membrane material layer is less than 6 microns thick.

13. The process according to claim 12, wherein the membrane material layer is equal to or less than 4 microns thick.

14. The process according to claim 2, wherein the patterning of the etch mask layer is done by a lithographic technique.

15. The process according to claim 2, wherein the etching is anisotropic etching directed from the backside of the semiconductor wafer.

16. The process according to claim 15, wherein the anistropic etching is accomplished with a potassium hydroxide solution.

17. The process according to claim 2, wherein the opening has a dimension that is at least 20 millimeters.

18. A pellicle membrane structure, comprising:

a layer of crystalline semiconductor material having a backside, a frontside and a periphery with an opening through the crystalline semiconductor material from the backside to the frontside;

a layer of pellicle membrane protection material on a portion of the frontside of the crystalline semiconductor material, between the opening and the periphery; and a layer of membrane material having a thickness less than 6 microns that covers the opening and is also on the layer of pellicle membrane protection material.

19. The pellicle membrane structure according to claim 18, further comprising:

a layer of etch mask material on the backside of the crystalline semiconductor material, between the opening and the periphery.

20. The pellicle membrane structure according to claim 18, wherein the crystalline semiconductor material is silicon.

21. The pellicle membrane structure according to claim 19, wherein the etch mask material is one of SiCN and SiOC.

22. The pellicle membrane structure according to claim 18, wherein the membrane material comprises one of Silicon Flouride (SiOF), calcium fluoride ($CaF_2$), magnesium fluoride ($MgF_2$) and aluminum fluoride ($AlF_3$).

23. The pellicle membrane structure according to claim 18, wherein the pellicle membrane protection material is one of SiCN and SiOC.

* * * * *